United States Patent [19]

Min et al.

[11] Patent Number: 5,487,923
[45] Date of Patent: Jan. 30, 1996

[54] METHOD FOR DEPOSITING TUNGSTEN NITRIDE THIN FILMS FOR FORMATION OF METAL WIRINGS OF SILICON SEMICONDUCTOR ELEMENTS

[75] Inventors: Suk-ki Min; Yong T. Kim, both of Seoul, Rep. of Korea

[73] Assignee: Korea Institute of Science and Technology, Seoul, Rep. of Korea

[21] Appl. No.: 155,915

[22] Filed: Nov. 23, 1993

Related U.S. Application Data

[63] Continuation of Ser. No. 912,378, Jul. 13, 1992, abandoned.

[30] Foreign Application Priority Data

Jul. 16, 1991 [KR] Rep. of Korea ................. 12125/1991

[51] Int. Cl.$^6$ ................................................. C23C 16/00
[52] U.S. Cl. ..................... 427/569; 427/255; 427/255.1; 427/255.2
[58] Field of Search ................. 427/255, 255.1, 427/255.2, 569

[56] References Cited

U.S. PATENT DOCUMENTS 4,963,394  10/1990  Willer .......................................... 427/8

FOREIGN PATENT DOCUMENTS 64-5015  1/1989  Japan .

OTHER PUBLICATIONS

Japanese Patent Abstracts, No. 1–5015, Jan. 1989.
Joshi et al., "The Role of Process Parameters of Selective W Deposited by $SiH_4$, $H_2$, and $WF_6$ Chemistry in Terms of Shallow Junction Leakage," Proceedings on the 1988 Workshop on Tungsten and Other Refractory Metals for VLSI Application IV, Materials Research Society, Pittsburgh, 1985, pp. 85–92 no month.
Wolf et al., "Silicon Processing in the VLSI Era," Lattice Press, Sunbeach, pp. 399–405 no date.
Colgan et al., "Comparison of Temperature Control Methods in a Cold–Wall Single–Wafer LPCVD System," 1989 Materials Research Society, pp. 205–209 no month.
Bunshah, "Deposition Technologies for Films & Coatings", p. 367 (1982).

*Primary Examiner*—Shrive Beck
*Assistant Examiner*—David M. Maiorana
*Attorney, Agent, or Firm*—Lowe, Price, LeBlanc & Becker

[57] ABSTRACT

A method for depositing tungsten nitride thin films prior to a formation of tungsten thin films using the plasma-enhanced chemical vapor deposition, capable of restraining an occurrence of corrosions at a silicon substrate, an oxide film and boundary surfaces thereof, during the formation of tungsten thin films. The deposition of tungsten nitride thin film is carried out using a plasma-enhanced chemical vapor deposition at a deposition temperature of 300° C. to 600° C. and a deposition pressure of 0.1–1 Torr while maintaining a $NH_3/WF_6$ partial pressure ratio at a range of 0.25 to 2. The obtained tungsten nitride thin film exhibits very low resistivity of 70 μΩ-cm to 300 μΩ-cm and effectively restrains an occurrence of corrosions at a silicon substrate, an oxide film and boundary surfaces thereof, during the formation of tungsten thin films using the plasma-enhanced chemical vapor deposition.

2 Claims, 3 Drawing Sheets

METHOD FOR DEPOSITING TUNGSTEN NITRIDE THIN FILMS FOR FORMATION OF METAL WIRINGS OF SILICON SEMICONDUCTOR ELEMENTS

This application is a continuation of application Ser. No. 07/912,378 filed Jul. 13, 1992, now abandoned.

BACKGROUND OF THE INVENTION

1. Field of the Invention

The present invention relates to a formation of metallic wirings in manufacturing highly integrated silicon semiconductor elements, and more particularly to a method for depositing a tungsten nitride thin film using feed gases of $WF_6$, $NH_3$ and $H_2$ with a plasma-enhanced chemical vapor deposition process, prior to a formation of a tungsten thin film using feed gases of $WF_6$ and $H_2$ with a plasma-enhanced chemical vapor deposition process, for restraining an occurrence of corrosions at a silicon substrate, an oxide film and boundary surfaces thereof, during the formation of tungsten thin films.

2. Description of the Prior Art

Fabrication techniques for highly integrated circuit elements have made remarkable progress for the last years and recently come to improve the integration degree up to a mega-bit level. Presently, researches for further improving the integration degree are actively advancing. In particular, it is known that metallic wiring formation, that is, metallization is the most important technique for providing improvements in signal processing rate and integration degree in highly integrated circuit elements of 4 mega-bits grade.

Conventionally, metallic wirings used in fabricating highly integrated circuit elements are made of aluminum or polycrystalline silicon thin films. In cases of aluminum thin films, they are formed using a physical deposition process, thereby exhibiting poor step coverage and electromigration characteristics. Upon alloying with silicon of substrates, these aluminum thin films also cause junction spikes which result in degrading yield and reliability of semiconductor elements.

In cases of polycrystalline silicon thin films, they have no problems involved in the aluminum thin films and thus exhibit superior characteristics in terms of reproductiveness and reliability. However, they have a fatal disadvantage that improvements in signal processing rate and integration degree are hardly expected, because of exhibiting a high resistivity.

On the other hand, recently developed metallization techniques include a method of depositing tungsten thin films using a low pressure chemical vapor deposition. Tungsten thin films obtained by this method exhibit a high thermal stability, by virtue of having a melting point of very high level, for example, 3,370° C. They also have the resistivity similar to that of aluminum thin films, thereby exhibiting a superior electromigration. They also have an advantage of improvements in step coverage and signal processing rate, in that the deposition thereof is achieved with the chemical vapor deposition process.

For the deposition of tungsten thin films using the chemical vapor deposition process as mentioned above, $WF_6$-$H_2$ reactant systems or $WF_6$-$SiH_4$-$H_2$ reactant systems are mainly used as reactant gas mixtures. During a reducing reaction of $WF_6$ in a reactant gas mixture, fluorine atoms are generated from the $WF_6$ feed gas which causes corrosions at a silicon substrate, an oxide film and boundary surfaces thereof by the reaction between the fluorine atoms and silicon. Such corrosions result in penetration of tungsten into the boundary surface between the silicon substrate and the oxide film or into the silicon substrate, thereby causing various problems of high leakage current, short circuiting and low insulation breakdown voltage.

For solving the problems resulting from the corrosions caused by fluorine, there has been proposed a method in which relative partial pressure ratios of $SiH_4$ and $H_2$ to $WF_6$ are properly adjusted to restrain the formation of fluorine while the deposition rate is increased to make a tungsten thin film itself function as a protection film for shielding fluorine to prevent it from reacting with the silicon substrate or the silicon oxide film. At some deposition temperatures and some compositions of reaction gas mixtures, however, this method loses the reliability (reference: R. V. Joshi, K. Y. Ahn, and P. M. Fryer, Proc. of the 1988 Workshop on Tungsten and Other Refractory Metals for VLSI Application IV, Material Research Soc., Pittsburgh, P.85, 1988).

To shield fluorine atoms generated from $WF_6$ in advance for preventing it from reacting with the silicon substrate or the silicon oxide film will be the ideal method capable of restraining the occurrence of corrosions at the silicon substrate, the oxide film and boundary surfaces thereof during the chemical vapor deposition of tungsten thin film, irrespective of relative composition ratios of $SiH_4$ and $H_2$ to $WF_6$ and deposition temperatures.

Referring to recently published literatures (for example, Silicon Processing for The VLSI Era, Ed. S. Wolf, R. N. Tauber, Lattice Press, Sunbeach, P.556, 1986), it is reported that upon comparing the etch rate of silicon oxide film with the etch rate of silicon nitride thin film by utilizing $NF_3$, the silicon nitride thin film is slower than the silicon oxide film by about 8:1. This means that an insulating thin film containing nitrogen atoms can not be easily etched out by the fluorine based etching gas. Therefore, if $NH_3$ gas in addition to the feeding gases of $WF_6$ and $H_2$ radicals, NH radicals will react with $WF_6$ and silicon surface and the binding structure of tungsten-nitrogen-silicon dangling bond on the bare silicon surface of silicon substrate should be formed. As a result, tungsten nitride thin film formed on the bare silicon surface prevent the reaction of fluorine atoms with bare silicon surface directly.

Based on this fact, the inventors found that a proper utilization of a tungsten thin film containing nitrogen exhibiting a property of protecting the tungsten layer from the penetration of fluorine atoms prior to the reaction of fluorine atoms and the silicon surface would make it possible to prevent the corrosions of the silicon substrate and the oxide film during the chemical vapor deposition of a tungsten thin film. In view of this point, the present invention has been made through various experiments of forming tungsten nitride thin films on silicon wafers.

The process of growing a tungsten nitride thin film on a silicon wafer involves a process which precedes the deposition of tungsten thin films for subsequent metallization. The tungsten nitride thin film grown with the process should not affect the intrinsic function of tungsten thin films as metallic wirings.

However, preceding simple coating of thin films containing nitrogen disables the formation of metallic wirings made of tungsten exhibiting a low resistivity, since most of thin films containing nitrogen are formed into insulation thin films.

SUMMARY OF THE INVENTION

Therefore, an object of the invention is to provide a method for depositing a tungsten nitride thin film using a plasma-enhanced chemical vapor deposition, prior to a formation of a tungsten thin film using the plasma-enhanced chemical vapor deposition, for a formation of a metallic wiring of a highly integrated silicon semiconductor element, wherein the deposition of the tungsten nitride thin film is carried out at a deposition temperature of 300° C. to 600° C. and using a $WF_6$-$H_2$ based reactant gas mixture added with $NH_3$, so as to prevent an occurrence of corrosions at a silicon substrate, an oxide film and boundary surfaces thereof due to fluorine atoms, during the formation of the tungsten thin film.

Tungsten nitride thin film deposited by the plasma-enhanced chemical vapor deposition according to the present invention exhibits very low resistivity of 70 $\mu\Omega$-cm to 300 $\mu\Omega$-cm. This tungsten nitride thin film has a characteristic that at a deposition thickness of 500 Å to 1,000 Å, it prevents an occurrence of corrosions at a silicon substrate, an oxide film and boundary surfaces thereof, even when a deposition of tungsten thin film as a metallization is carried out under the conditions resulting in a formation of the largest amount of fluorine atoms, that is, at a deposition temperature of 400° C. and a $WF_6$:$H_2$ partial pressure ratio of 1:3.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

Hereinafter, the method of the present invention will be described in detail, base on concrete test results shown in the annexed drawings.

The method of the present invention is carried out in a plasma-enhanced chemical vapor deposition reactor. In accordance with the present invention, first, $NH_3$ having the purity of 99.999% and $WF_6$ having the purity of 99.995% as reactant gases are injected into the reactor via flowmeters. In the reactor, the reactant gases are subjected to a discharge process applying to them a radio frequency electromagnetic field of 13.56 MHz at a power density of 0.7 W/cm$^2$ to 1 W/cm$^2$ thereby forming a plasma phase reactant gas mixture. At this time, $H_2$ as a reducing gas is added in the reactant gas mixture. The amount of added $H_2$ is determined to obtain $H_2$ partial pressure corresponding to about 20 times the total partial pressure of $NH_3$ and $WF_6$. In the reactor, the deposition pressure is constantly maintained at a range of 0.1 Torr to 1 Torr while the deposition temperature is maintained at a range of 300° C. to 600° C. With the above-mentioned conditions, tungsten nitride thin films having the thickness of 500 Å to 1,000 Å were obtained.

Figure 1:
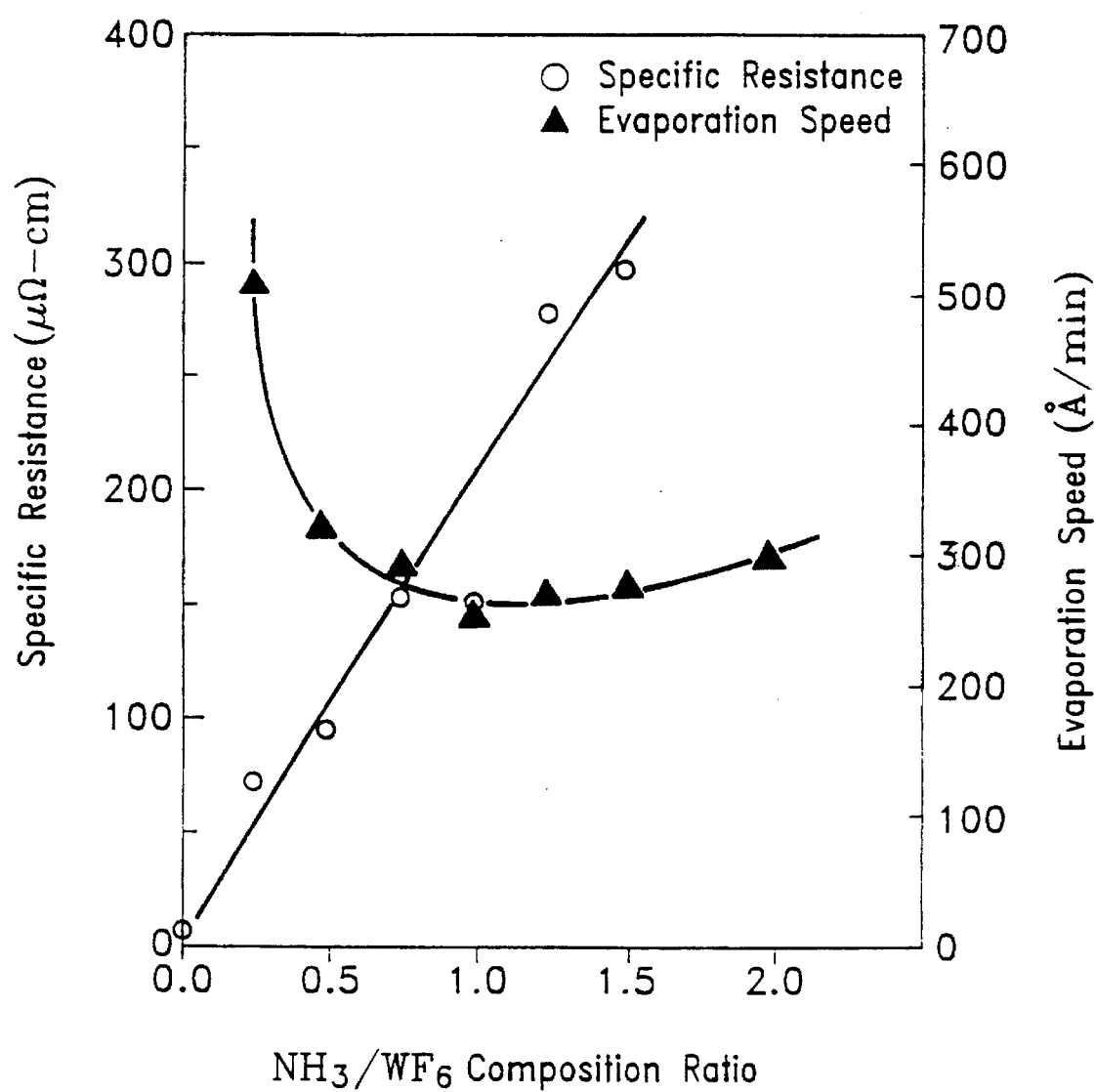
FIG. 1 is a graph illustrating variations in the resistivity and the reaction rate depending upon a variation in the $NH_3$/$WF_8$ partial pressure ratio of a reactant gas mixture.

FIG. 1 is a graph illustrating variations in the resistivity and the reaction rate depending upon a variation in the $NH_3$/$WF_6$ partial pressure ratio of a reactant gas mixture. As apparent from the graph, metallic thin films grown at $NH_3$/$WF_6$ partial pressure ratios ranging from 0.25 to 2 exhibit low resistivities ranging 70 $\mu\Omega$-cm to 300 $\|\Omega$-cm. When the $NH_3$/$WF_6$ partial pressure ratio is not less than 0.5, the deposition is achieved at a constant deposition rate, so that thin films having the constant thickness of not more than 500 Å can be obtained.

In cases of growing tungsten thin films by a low pressure chemical vapor deposition process, after the preceding deposition of tungsten nitride thin films with the thickness of 500 Å to 1,000 Å exhibiting the resistivity of 70 $\mu\Omega$-cm to 300 $\mu\Omega$-cm under the condition of maintaining the $NH_3$/$WF_6$ partial pressure ratio at a range of 0.25 to 2, the above-mentioned corrosions caused by fluorine can be prevented even under the condition of possibly resulting in most severe damages at silicon substrates, oxide films and boundary surfaces thereof.

Figure 2A:
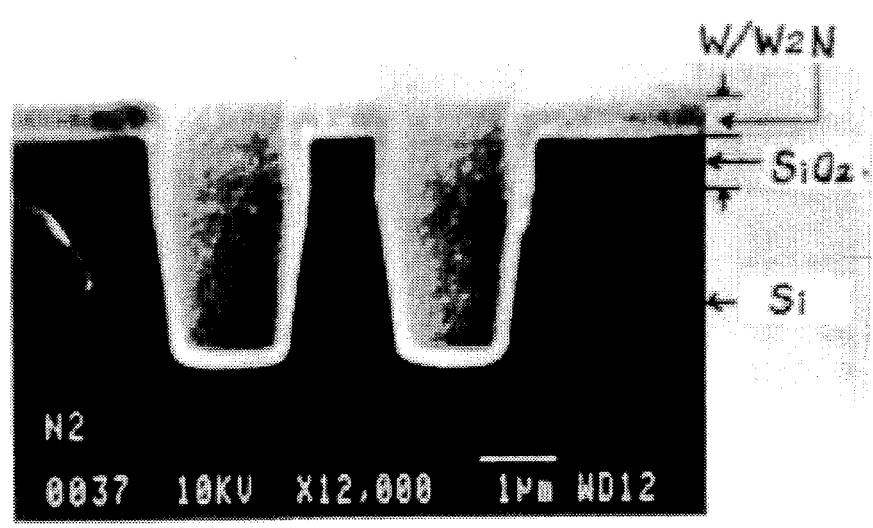
FIGS. 2A and 2B are optical microscopic photographs verifying the corrosion preventing effect of tungsten nitride thin films.
Figure 2B:
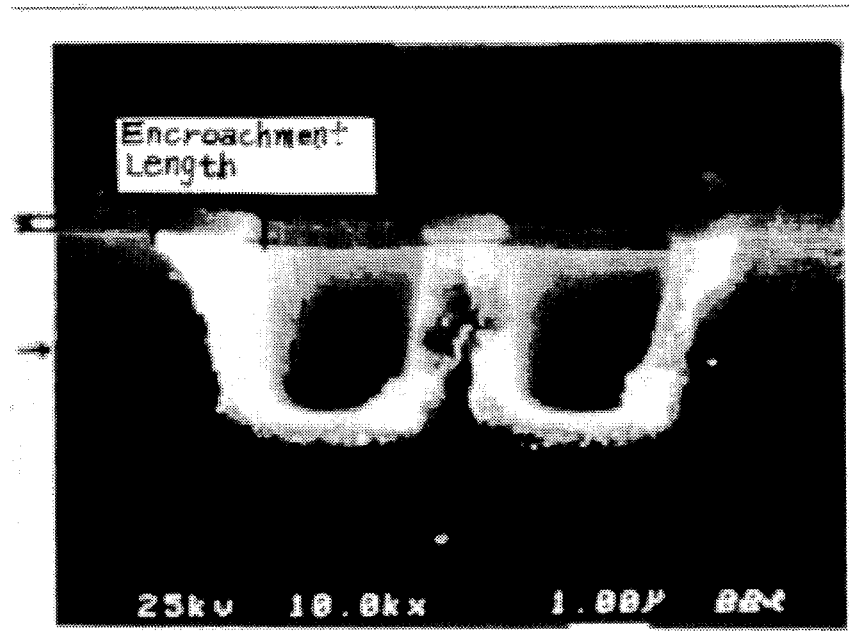

FIGS. 2A and 2B are optical microscopic photographs verifying the corrosion preventing effect of tungsten nitride structure of a semiconductor element in which a tungsten thin film is deposited under the condition resulting in a formation of the largest amount of fluorine atoms, that is, at a deposition temperature of 400° C. and a $WF_6$: $H_2$ partial pressure ratio of 1:3, after the preceding deposition of a tungsten nitride thin film according to the method of the present invention. On the other hand, the photograph of FIG. 2B shows a trench structure of a semiconductor element in which without the preceding deposition of tungsten nitride thin film, only a tungsten thin film is deposited under the same metallization condition as in the case of FIG. 1. From a comparison between two photographs, it can be found that the case of FIG. 2A exhibited no occurrence of defects at the silicon substrate, the oxide film and boundary surfaces thereof, due to fluorine formed during the deposition of tungsten thin film, whereas in case of FIG. 2B, the oxide film and its boundary surfaces was damaged due to the fluorine.

Figure 3:
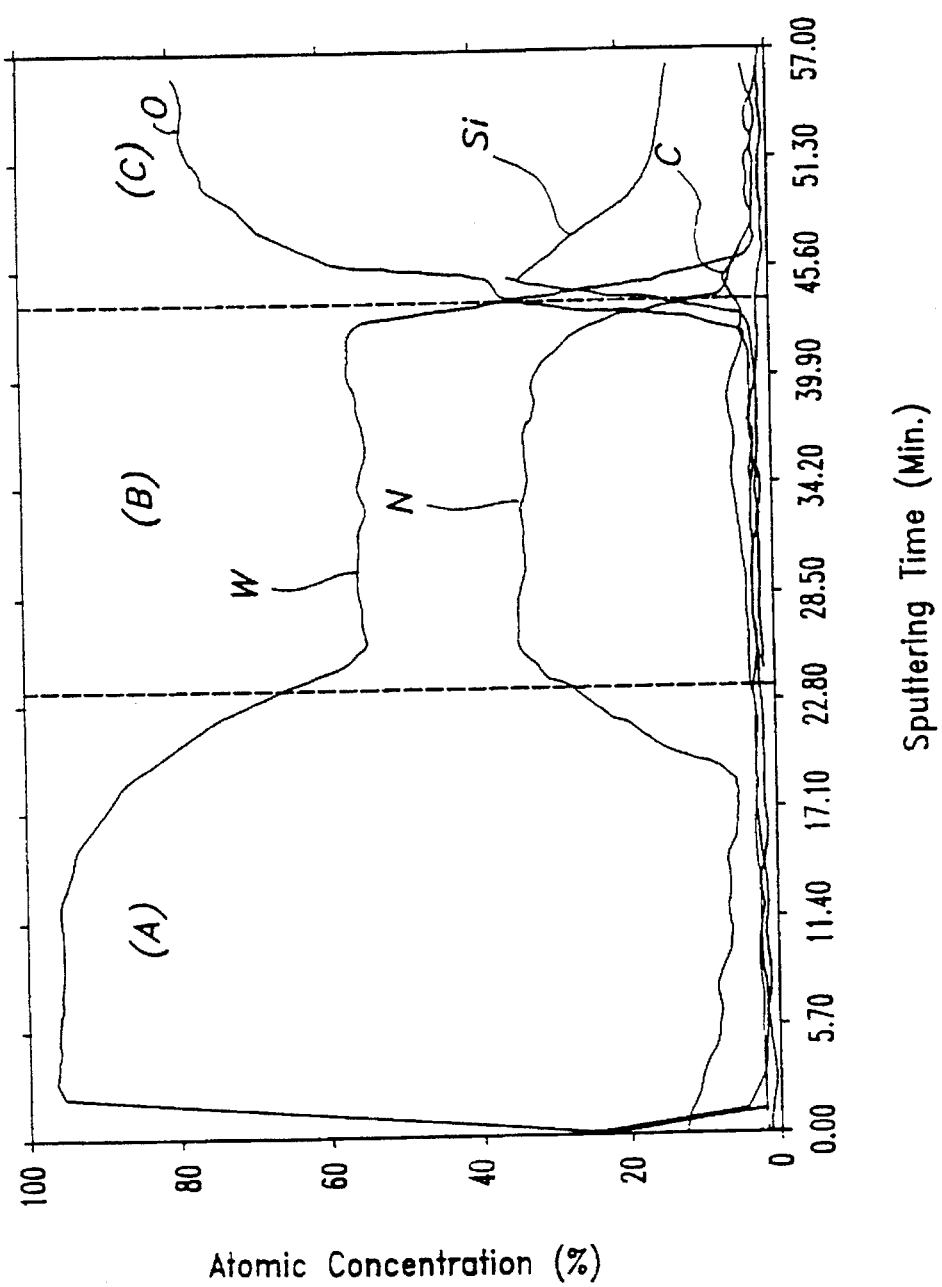
FIG. 3 is an Auger in-depth profile illustrating results tungsten thin film/tungsten nitride thin film/oxide film structure obtained according to an embodiment of the present invention.

FIG. 3 is an Auger in-depth profile illustrating results obtained by analyzing, by an Auger electron spectroscopy, a tungsten thin film/tungsten nitride thin film/oxide film structure obtained by carrying out a preceding deposition of tungsten nitride thin film and then a deposition of tungsten thin film over the deposited tungsten nitride thin film. The analysis was carried out for the thickness portion of structure from the surface of tungsten thin film to the boundary surface of tungsten nitride thin film being in contact with the oxide film.

In the Auger in-depth profile, regions A, B and C correspond to the tungsten thin film, the tungsten nitride thin film having a depth of about 1,000 Å and the oxide film, respectively. From the Auger in-depth profile, it can be found that the oxide film was not subjected to any attack of fluorine during the deposition of tungsten thin film.

Therefore, it can be also found that the deposition of tungsten nitride film prior to the deposition of tungsten thin film makes it possible to prevent an occurrence of corrosions at a silicon substrate, an oxide film and boundary surfaces thereof.

As apparent from the above description, the present invention provides a method for depositing tungsten nitride thin film exhibiting a resistivity of 70 $\mu\Omega$-cm to 300 $\mu\Omega$-cm by using a plasma-enhanced chemical vapor deposition, prior to a formation of tungsten thin film. The tungsten nitride thin film provides an advantage of effectively restraining an occurrence of corrosions at a silicon substrate, an oxide film and boundary surfaces thereof, due to fluorine, during the formation of tungsten thin films.

What is claimed is:

1. A method of forming a metallic wiring for a silicon semiconductor device which comprises:

providing a silicon semiconductor substrate;

depositing a layer of tungsten nitride on said silicon semiconductor substrate by a radio frequency plasma enhanced chemical vapor deposition process which utilizes a $WF_6$-$NH_3$-$H_2$ reactant gas mixture and a 13.56 MHz glow discharge; and depositing a layer of tungsten on said layer of tungsten nitride by a plasma enhanced chemical vapor deposition process which utilizes a $WF_6$-$H_2$ reactant gas mixture and a 13.56 MHz glow discharge and produces fluorine atoms from the $WF_6$, wherein said tungsten nitride layer prevents corrosion of said silicon semiconductor substrate by said fluorine atoms during the deposition of said tungsten layer.

2. A method of forming a metallic wiring for a silicon semiconductor device according to claim 1, wherein said tungsten nitride is deposited using a 13.56 MHz glow discharge of $WF_6$-$NH_3$-$H_2$ without DC negative bias while maintaining a $NH_3$/$WF_6$ partial pressure ratio in a range of 0.25 to 2 at a deposition temperature of 300° C. to 600° C. and a deposition pressure of 0.1 to 1 Torr.

* * * * *